US011837432B1

(12) United States Patent
Nogan et al.

(10) Patent No.: US 11,837,432 B1
(45) Date of Patent: Dec. 5, 2023

(54) GAS DELIVERY SYSTEM FOR ENVIRONMENTAL TRANSMISSION ELECTRON MICROSCOPE

(71) Applicant: National Technology & Engineering Solutions of Sandia, LLC, Albuquerque, NM (US)

(72) Inventors: John Joseph Nogan, Albuquerque, NM (US); Katherine Leigh Jungjohann, Sandia Park, NM (US); Raymond Vernon Puckett, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 605 days.

(21) Appl. No.: 17/104,299

(22) Filed: Nov. 25, 2020

Related U.S. Application Data

(60) Provisional application No. 62/939,982, filed on Nov. 25, 2019.

(51) Int. Cl.
*H01J 37/26* (2006.01)
(52) U.S. Cl.
CPC ............................ *H01J 37/261* (2013.01)

(58) Field of Classification Search
CPC .. H01J 37/00; H01J 37/02; H01J 37/26; H01J 37/28; H01J 37/261; H01J 37/16; H01J 37/18; H01J 37/185
USPC ........................... 250/306, 307, 311, 441.11
See application file for complete search history.

(56) References Cited

U.S. PATENT DOCUMENTS

| 3,593,023 A * | 7/1971 | Dodson | G01N 1/2258 |
| | | | 73/23.31 |
| 6,120,606 A * | 9/2000 | Peng | H01J 37/18 |
| | | | 118/733 |
| 2008/0067408 A1* | 3/2008 | Winkler | H01J 37/08 |
| | | | 250/423 F |
| 2014/0042318 A1* | 2/2014 | Yaguchi | H01J 37/20 |
| | | | 250/311 |
| 2016/0033355 A1* | 2/2016 | Gardiner | G05B 9/02 |
| | | | 700/283 |

* cited by examiner

*Primary Examiner* — Jason L McCormack
(74) *Attorney, Agent, or Firm* — Kevin W. Bieg

(57) ABSTRACT

A portable, compact gas delivery system can support an environmental transmission electron microscope. Environment transmission electron microscopy provides researchers a unique capability of assessing a material's surface conditions at atomic resolution in a variety of reactive and oxidizing environments. The ability to precisely control the analysis chamber's environmental conditions over time is key to the success of a typical surface analysis. The gas delivery system provides the correct balance or pressure delivery precision, contamination control, and gas isolation.

4 Claims, 2 Drawing Sheets

GAS DELIVERY SYSTEM FOR ENVIRONMENTAL TRANSMISSION ELECTRON MICROSCOPE

CROSS-REFERENCE TO RELATED APPLICATION

This application claims the benefit of U.S. Provisional Application No. 62/939,982, filed Nov. 25, 2019, which is incorporated herein by reference.

STATEMENT OF GOVERNMENT INTEREST

This invention was made with Government support under Contract No. DE-NA0003525 awarded by the United States Department of Energy/National Nuclear Security Administration. The Government has certain rights in the invention.

FIELD OF THE INVENTION

The present invention relates to gas delivery systems and, in particular, to a portable, compact gas delivery system that can provide a precisely controlled gas flow to an environmental transmission electron microscope.

SUMMARY OF THE INVENTION

The portable, compact gas delivery system of the present invention provides a control methodology to deliver a large variety of pure gases under highly dynamic pressure and flow requirements to, for example, an environmental transmission electron microscope (ETEM) in a small, yet portable, footprint. The system provides a means to rapidly change gas concentrations to an ETEM's process gas feed point in preparation for a variety of experimental conditions. The system minimizes vibration transmission by using a differentially pumped gas feedline configuration. The system not only can support ETEM applications, the system is universal enough to address a wide variety of other laboratory experimental equipment needs at low cost and with great flexibility.

BRIEF DESCRIPTION OF THE DRAWINGS

The detailed description will refer to the following drawings, wherein like elements are referred to by like numbers.

DETAILED DESCRIPTION OF THE INVENTION

The present invention is directed to a portable, compact gas delivery system that can be used with an environmental transmission electron microscope (ETEM) and other instruments. Environmental transmission electron microscopy provides researchers with a unique ability to assess a material's surface states at atomic resolution in a variety of reactive and oxidizing environments. The ability to precisely control the analysis chamber's environmental conditions over time is key to the success of a typical surface analysis.

Figure 1:
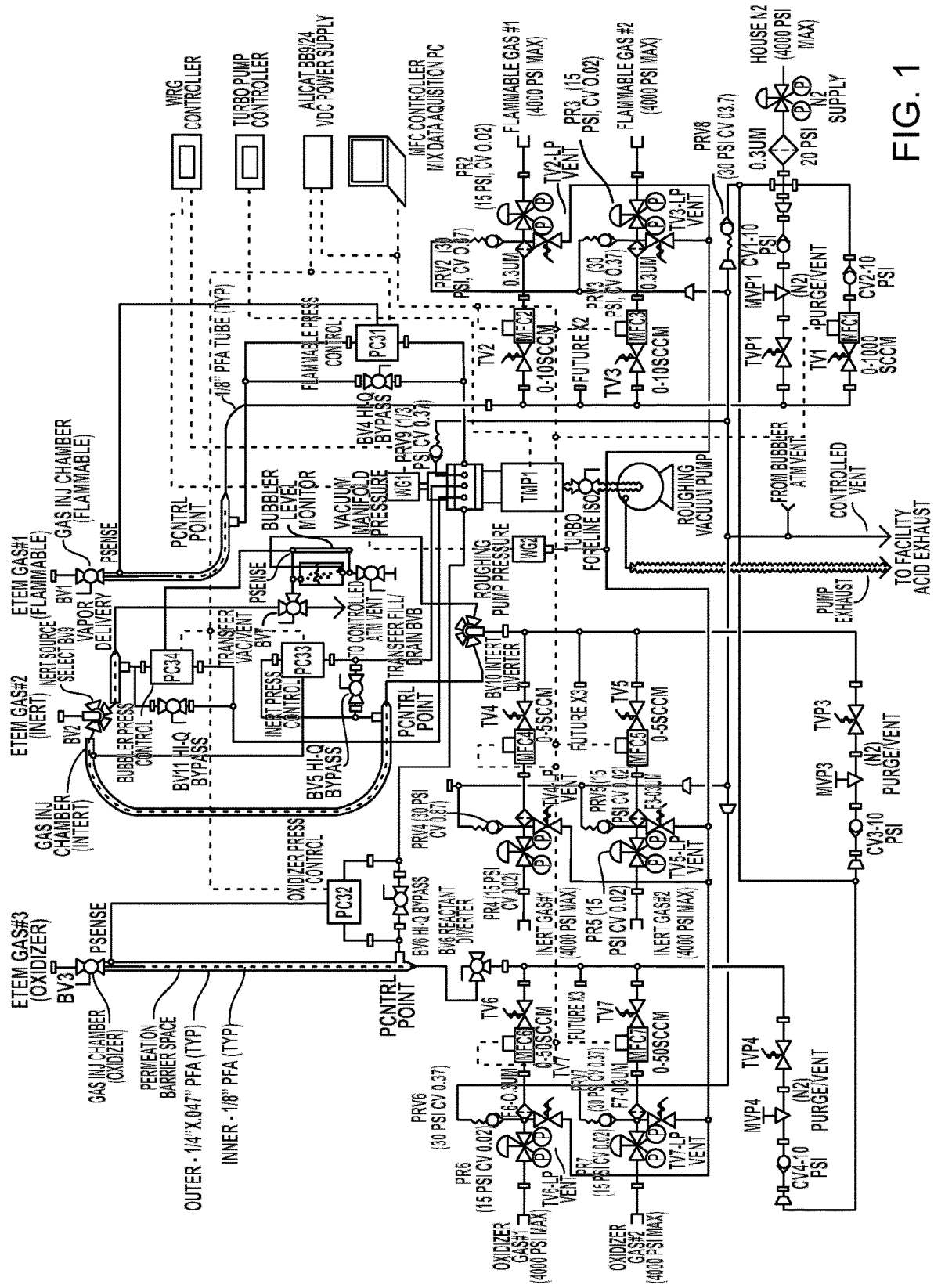
FIG. 1 is a schematic illustration of a portable, compact gas delivery system for an environmental transmission electron microscope.
Figure 2:
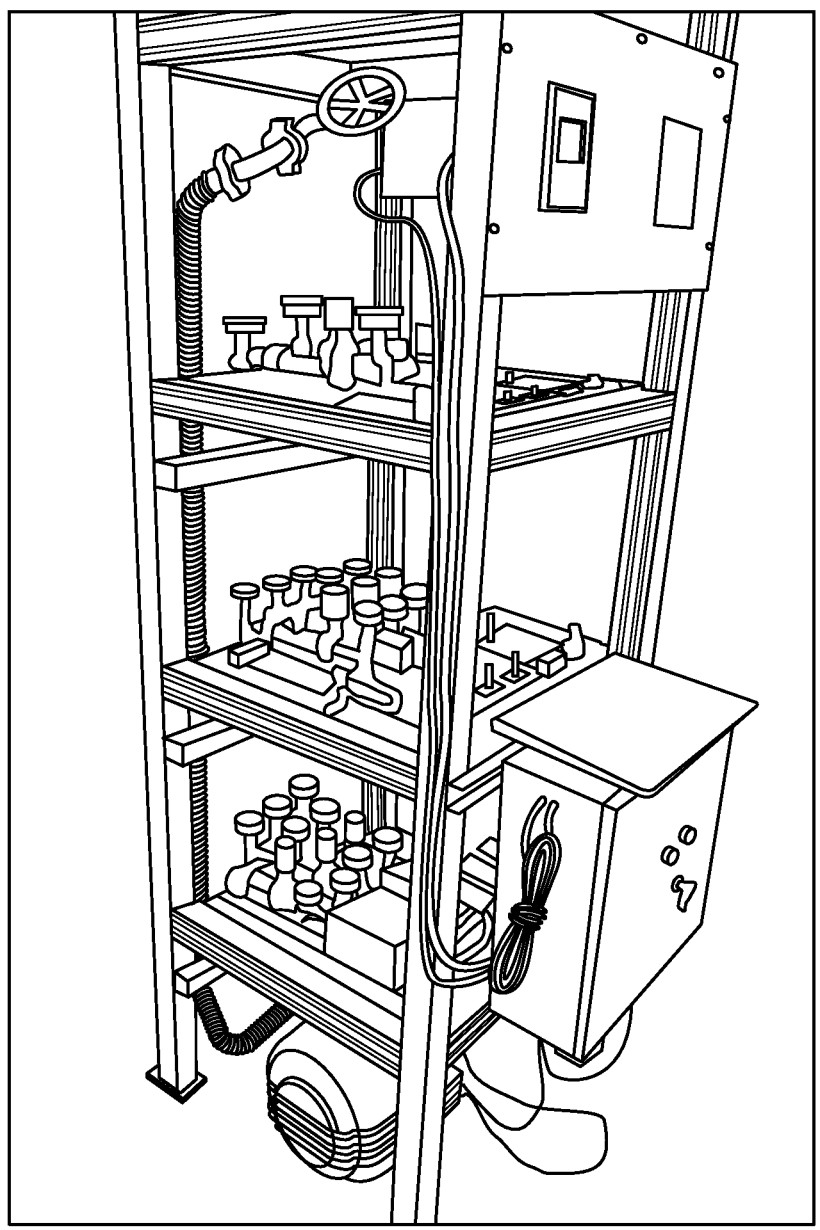
FIG. 2 is a photograph of a portable, compact gas delivery system for an environmental transmission electron microscope.

An exemplary gas delivery system for an ETEM is shown in FIG. 1. The gas delivery system is highly versatile with the ability to deliver individual or blends of multiple, high-purity process gas supplies to the independent process gas feed points of an ETEM. The gas delivery system comprises one or more process gas inlets (FLAMMABLE GAS #1, FLAMMABLE GAS #2, INERT GAS #1, INERT GAS #2, OXIDIZER GAS #1, OXIDIZER GAS #2) and one or more process gas outlets (ETEM GAS #1 (FLAMMABLE), ETEM GAS #2 (INERT), ETEM GAS #3 (OXIDIZER)) that provide the process gases to the process gas feed points of the ETEM. In this example, flammable gases from each of the two flammable gas inlets (FLAMMABLE GAS #1 and FLAMMABLE GAS #2) can be precisely metered by electronic flow meters and blended with a metered house nitrogen gas supply (N2 SUPPLY) to feed a low volume flammable gas injection chamber (GAS INJ CHAMBER (FLAMMABLE)) that delivers the blended flammable gas to a flammable gas outlet (ETEM GAS #1 (FLAMMABLE). Further in this example, inert gases from the two inert gas inlets (INERT GAS #1 and INERT GAS #2) can be precisely metered by electronic flow meters and blended. The blended inert gas can be diverted by an inert gas diverter (INERT DIVERTER) to either direclty feed an inert gas source selector (INERT SOURCE SELECT), or be diverted to a bubbler (BUBBLER) in which the blended inert gas is bubbled through a liquid (e.g., water) and the resulting vapor feeds the inert gas source selector (INERT SOURCE SELECT) via a vapor delivery line (VAPOR DELIVERY). The inert gas source selector (INERT SOURCE SELECT) can then select either the blended inert gas line or the vapor line to feed the low volume inert gas injection chamber (GAS INJ CHAMBER (INERT)) which delivers the selected gas to the inert gas outlet (ETEM GAS #2 (INERT)). Likewise, in this example, each of the two oxidizer gas inlets (OXIDIZER GAS #1 and OXIDIZER GAS #2) can be precisely metered by electronic flow meters and blended. If needed for an experiment, the blended oxidizer gas can diverted by a reactant diverter (REACTANT DIVERTER) to feed a low volume oxidizer gas injection chamber (GAS INJ CHAMBER (OXIDIZER)) that delivers the blended oxidizer gas to oxidizer gas outlet (ETEM GAS #3 (OXIDIZER)). The system is portable, utilizing a three-dimensional design concept that only consumes approximately 4 $ft^2$ of lab floor space, as shown in FIG. 2.

The ETEM itself has very specific process gas delivery requirements that conventional, mechanically regulated pressure delivery and control schemes cannot accommodate with any level of precision. For example, an ETEM can require ultra-low, typically 1-10 standard cubic centimeter per minute (sccm), dynamic gas flow rates at a feed pressure of less than 0.5 Pascals or 300 Torr. Typical sub-atmospheric mechanically regulated gas delivery systems would require continuous manual adjustment to maintain pressure control under varying supply and demand conditions. Manual pressure control often leads to problems with overshoot or flow cut-off, risking a disruption of gas delivery to the ETEM at critical periods during an experiment. It may also cause over pressurization of the gas delivery system that could easily trip protective ETEM pressure interlocks, ruining the experiment. To reduce experimental risks, the gas delivery system of the present invention buffers varying supply and demand conditions by providing precise electronic pressure control to differentially pumped low volume (<1 cubic centimeter) gas injection chambers (GAS INJ CHAMBER) located at the process gas oulets. Flow through the system's pressure control apparatus (FLAMMABLE PRESS CONTROL, OXIDIZER PRESS CONTROL, INERT PRESS CON- TROL, BUBBLER PRESS CONTROL) range from 0.1 to 100 sccm at a constant delivery pressure from 1 to 300 Torr for ETEM applications and up to 1000 Torr for other applications. As ETEM flow demand increases or decreases, the various pressure controllers (PC31, PC32, PC33, PC34) compensate accordingly to maintain a +/−1 Torr of set point accuracy. High precision flow and pressure control combined with low delivery volume provides a means to quickly adjust gas composition of compatible chemistries while an experiment in progress.

Another complexity that often complicates ETEM experimental results is vibration and the introduction of water or oxygen to the process stream through permeation. This can be mitigated by proper material selection which balances of the strengths and weaknesses of the common materials used in the construction of the gas delivery system. Conventional techniques include rigid metal or convoluted metal tubing. Rigid smooth wall electropolished tubing reduces water surface tension and inhibits permeation, but allows the transmission of vibration between objects. Metal convoluted tubing reduces vibration effects, but at the expense of increased surface area and low velocity trapped space. The present system mitigates the problem by incorporating a vibration-isolating, coaxial, differentially pumped gas feedline that fluidically connects each of the process gas supplies to the low volume gas injection chambers and process gas outlets. The feedline can comprise a flexible, high-density polymer that dampens vibrations. For example, perfluoroalkoxy (PFA) is a flexible, high-density Teflon-based material that reduces vibration transmission at the expense of increased permeation. This is where the coaxial, differentially pumped gas line configuration provides benefit. The internal wall of the internal primary tube (INNER PFA, as shown by the dashed line in FIG. 1) is at the highest pressure providing a direct flow of the process gas to the low volume gas injection chamber at the process gas outlet. The exterior wall of the primary tube passes through the interior of a secondary tube (OUTER PFA, shown as a solid line in FIG. 1) creating a very narrow, low volume annular space between the two tubes (PERMEATION BARRIER SPACE). The secondary tube operates at a slightly lower pressure than the primary tube and a significantly lower pressure than the exterior of the secondary tube. This annular space provides a return path for gas to flow from the system's low volume gas injection chamber directly to the inlet of a pressure controller (e.g., PC32) and out of the system through a turbo molecular pump (TMP1). This effectively provides a swept volume in the annular space to collect and sweep contaminants permeating through the secondary tube and preventing those contaminants from permeating through the primary tube to the process gas outlet and, consequently, to the ETEM.

The present invention has been described as a portable, compact gas delivery system for an environmental transmission electron microscope or other instrument. It will be understood that the above description is merely illustrative of the applications of the principles of the present invention, the scope of which is to be determined by the claims viewed in light of the specification. Other variants and modifications of the invention will be apparent to those of skill in the art.

We claim:

1. A gas delivery system, comprising:
one or more process gas inlets, each of which supplies a process gas,
an electronic pressure controller for controlling the pressure of the process gas delivered from each of the one or more process gas inlets to one or more low volume gas injection chambers,
a vibration-isolating coaxial gas feedline fluidically connecting each of the one or more process gas inlets to each of the one or more low volume injection chambers, wherein each coaxial gas feedline comprises an inner primary tube for flow of the process gas therein, and a coaxial outer secondary tube providing an annular permeation barrier space between the inner primary tube and the outer secondary tube that is differentially pumped to remove contaminants, and
a process gas outlet connected to each of the one or more low volume gas injection chambers for delivering the process gas from the low volume gas injection chamber to a feed point of an instrument.

2. The gas delivery system of claim 1, wherein at least one of the inner primary tube or the outer secondary tube comprises a flexible, polymer that dampens vibrations.

3. The gas delivery system of claim 1, wherein the instrument comprises an environmental transmission electron microscope.

4. The gas delivery system of claim 1, wherein the process gas comprises a flammable gas, an inert gas, or an oxidizer gas.

* * * * *